(12) United States Patent
Cooke

(10) Patent No.: US 8,598,888 B2
(45) Date of Patent: Dec. 3, 2013

(54) SYSTEM AND METHOD FOR IMPROVED TESTING OF ELECTRONIC DEVICES

(75) Inventor: Vernon Cooke, Tigard, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 640 days.

(21) Appl. No.: 12/773,549

(22) Filed: May 4, 2010

(65) Prior Publication Data

US 2011/0273184 A1    Nov. 10, 2011

(51) Int. Cl.
*G01R 31/02* (2006.01)

(52) U.S. Cl.
USPC ........................................ 324/537; 324/750.16

(58) Field of Classification Search
USPC .......................................................... 324/537
See application file for complete search history.

(56) References Cited

U.S. PATENT DOCUMENTS

| | | | |
|---|---|---|---|
| 4,747,479 A | 5/1988 | Herrman | |
| 4,997,552 A | 3/1991 | Schlinkmann et al. | |
| 5,808,265 A * | 9/1998 | Cecil | 219/109 |
| 5,842,579 A | 12/1998 | Garcia et al. | |
| 6,360,866 B1 | 3/2002 | Chiba et al. | |
| 6,435,338 B1 | 8/2002 | Iwamoto | |
| 6,483,333 B2 | 11/2002 | Tverdy et al. | |
| 6,497,319 B2 | 12/2002 | Atsumi et al. | |
| 6,504,384 B1 | 1/2003 | Tsuchiya et al. | |
| 6,621,261 B2 | 9/2003 | Tsuchiya | |
| 6,727,685 B2 | 4/2004 | Kojima | |
| 6,948,376 B2 | 9/2005 | Ogasawara | |
| 6,970,008 B2 | 11/2005 | Lu | |
| 6,988,609 B2 | 1/2006 | Kojima | |
| 7,119,299 B2 | 10/2006 | Kojima et al. | |
| 2002/0109517 A1 | 8/2002 | Tverdy et al. | |
| 2008/0134809 A1 | 6/2008 | Lee | |
| 2008/0290004 A1 | 11/2008 | Tsai et al. | |
| 2010/0256802 A1 * | 10/2010 | Garica et al. | 700/218 |

FOREIGN PATENT DOCUMENTS

| | | |
|---|---|---|
| JP | 10-142293 A | 5/1998 |
| KR | 2008032523 A | 4/2008 |
| KR | 2008/072131 A | 8/2008 |

OTHER PUBLICATIONS http://www.mirae.com (products)(LED) Feb. 24, 2010—1 page.
International Search Report and Written Opinion of PCT/US2011/034806, 5 pages.

* cited by examiner

*Primary Examiner* — Thomas Valone

(57) ABSTRACT

An improved method of testing and sorting electronic devices uses two or more test stations and two or more sorting stations applied to a single track to improve system throughput. Applying two or more test stations and two or more sorting stations to a single track accomplishes improved system throughput while increasing system cost less than would be expected if a duplicate track was installed for each test station.

20 Claims, 2 Drawing Sheets

SYSTEM AND METHOD FOR IMPROVED TESTING OF ELECTRONIC DEVICES

TECHNICAL FIELD

The present invention regards improved systems and methods for testing and sorting electronic devices. In particular it regards systems and methods for testing electrical and/or optical properties of miniature electronic devices. In more particular it regards a system and method for testing at least two miniature device properties at high speed in parallel and sorting them into categories according to those properties using two separate testing stations and one test track.

BACKGROUND OF THE INVENTION

Many electronic devices are tested for electrical and/or optical properties during manufacturing by automated test systems. Typical automated test systems use precision electrical and/or optical test equipment to find values associated with electrical and optical properties of a device and either accept, reject or sort it into an output category depending upon the measured values. For miniature devices, automated test systems are often designed to handle bulk loads, where the manufacturing process creates a volume of devices which have substantially identical mechanical characteristics such as size and shape but differ in electrical and/or optical characteristics. It is common practice to build a volume of devices with electrical and optical properties which generally fall within a range and rely on testing to sort the devices into commercially useful groups with similar characteristics. Typical electronic devices tested and sorted in this fashion include passive components such as resistors, capacitors and inductors and active electronic devices such as digital or analog integrated circuits or light emitting diodes.

These devices are often supplied to the automated test system as containers filled with devices. Typically the automated test system must extract a single device from the bulk load of devices in a process called singulation, orient the device and fixture it so the test equipment can perform the desired tests. Testing often requires probing the device, wherein electrical leads are brought into contact with the device to permit signals and power to be applied to the device and to monitor responses to the inputs. The task of the automated test system is to determine the electrical characteristics of devices and sort the devices into groups depending upon those characteristics. The automated test system typically singulates devices onto a track where the devices are indexed past one or more test stations where various electrical and/or optical properties of the device are tested and the results stored. As the devices are subsequently indexed past the sorting stations, the devices are removed from the track and deposited in one of a number of bins depending upon the results of the preceding tests. A typical prior art automated test system is shown in FIG. 1, where a track 2 with locations 3, 4 spaced "p"=pitch distance apart are indexed by the track 2 in the direction of the arrow along a route to the loader 5 where bulk parts 6 are loaded 7 onto the track. The device 7 is indexed by the track 2 along the route to location 10 where it is tested by test station 9 and the results stored on a controller (not shown). The device 7 is subsequently indexed by track 2 along the route to location 11 where the sort tube 12 removes the device 13 from the track 2 for sorting.

U.S. Pat. No. 5,842,579 ELECTRICAL CIRCUIT COMPONENT HANDLER, inventors Douglas J. Garcia, Steven D. Swendrowski, Mitsuaki Tani, Hsang Wang, Martin J. Twite, III, Malcolm Hawkes, Evart David Shealey, Martin S. Voshell, Jeffrey L. Fish and Vernon P. Cooke, Dec. 1, 1998, assigned to the assignee of this invention, discloses a rotary disk test machine with multiple tracks able to test multiple parts at once. Another exemplary system that uses duplicate tracks to test devices in parallel is the MT20 LED tester manufactured by Mirae Corporation, Chungcheongnam-Do 331-220, Korea. The track holding the devices does not have to be rotary. U.S. Pat. No. 4,747,479 DEVICE FOR THE TESTING AND/OR PROCESSING OF SMALL COMPONENT PARTS, inventor Jakob Herrman, May 31, 1988 discloses a linear belt to hold parts under test. What these disclosures do not consider is the possibility of testing more than one device in parallel without having to duplicate the tracks that feed parts to the test stations whether they are rotary or linear.

What is needed, then, is an automated test system for testing and sorting miniature electronic devices that can test at least two devices in parallel and sort them at high speed using a single track to deliver devices to the test stations.

SUMMARY OF THE INVENTION

Aspects of the instant invention provide an improved method of testing and sorting electronic devices based on electrical and/or optical properties using an automated test system which carries parts to be tested on a track. The improvements include providing the test system with first and second test stations adjacent to the track and testing a portion of the devices on the first test station and testing another portion of the devices on the second test station. The devices are then sorted based on the test with a sorting mechanism according to the test results. The system tests and sorts said electronic devices with two test stations on one track. The instant invention performs these tests in parallel, thereby increasing the throughput over systems which test devices serially, and at less expense than systems which test parts in parallel by duplicating the track mechanism.

Aspects of this invention index the track and the devices in order to process the devices. Indexing refers to stop/start type motion where the track is moved to a position, stopped for a period of time and then moved to a next position. In the case of automated test systems, the track is typically indexed from load position, where the devices are put in the track, to test position where the device is tested, to sort position where the devices are removed from the track and sorted into bins and then back to load position in a series of steps. The instant invention is able to process devices in parallel on a single track by offsetting the positions of the test stations so that when the track is indexed by a predetermined amount greater than the pitch between adjacent devices, one device will be presented to the first test station, while another device will be presented to the second test station. Since the track is indexing twice as far per unit time, the system throughput will be nearly doubled.

To achieve the foregoing and other objects in accordance with the purposes of the present invention, as embodied and broadly described herein, a method and apparatus is disclosed.

DETAILED DESCRIPTION OF PREFERRED EMBODIMENTS

Embodiments of this invention are improved systems and methods for testing and sorting of miniature electronic devices. Embodiments of the instant invention provide an improved method of testing and sorting electronic devices based on electrical and/or optical properties using an automated test system which carries parts to be tested on a track. The improvements include providing the test system with first and second test stations adjacent to the track and testing a portion of the devices on the first test station and testing another portion of the devices on the second test station. The devices are then sorted based on the test with a sorting mechanism according to the test results. The system tests and sorts said electronic devices with two test stations on one track. The instant invention performs these tests in parallel, thereby increasing the throughput over systems which test devices serially, and at less expense than systems which test parts in parallel by duplicating the track mechanism.

Embodiments of this invention employ tracks having locations which fixture or hold securely electronic devices for testing. Embodiments of this invention index the track and the fixtured devices in order to process the devices. Indexing refers to stop/start type motion where the track and the fixtured devices are moved to a position, stopped for a period of time and then moved to a next position.

Figure 1:
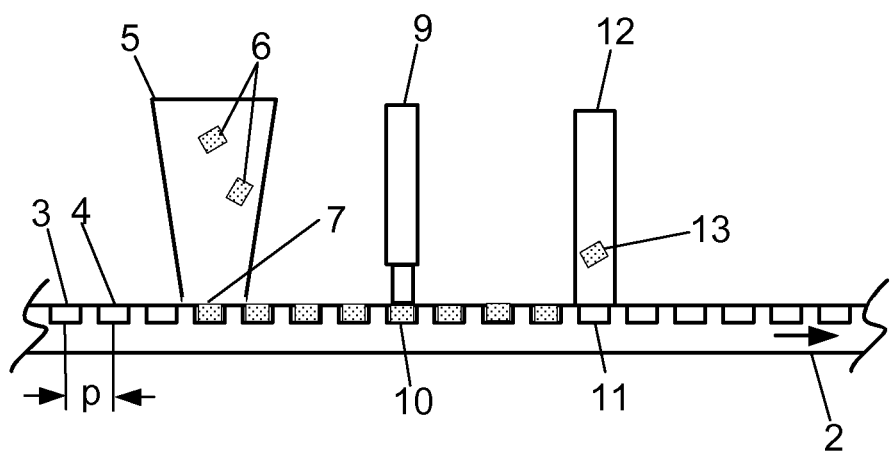
FIG. 1. Prior art automated test system.
Figure 2:
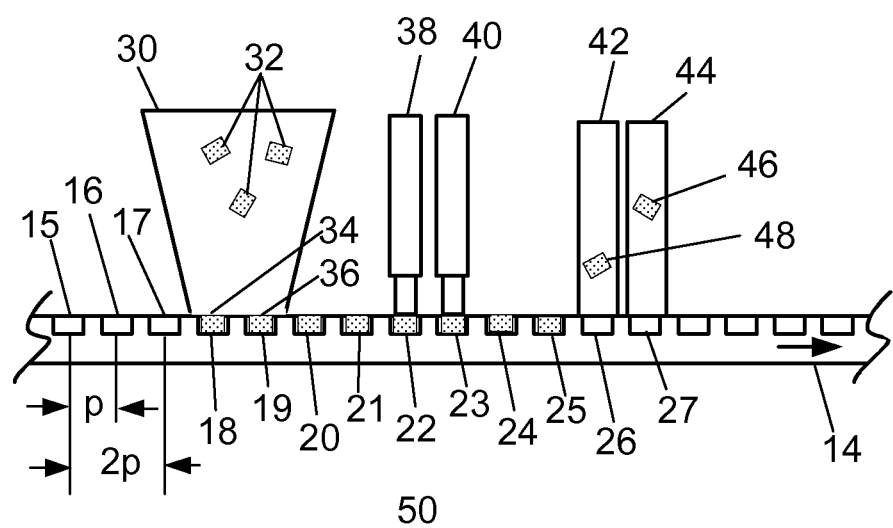
FIG. 2. Automated test system showing duplex device arrangement.

For example, FIG. 2 shows an embodiment of this invention, comprising a single track automated test system 50 with a track 14, which indexes in the direction of the arrow along a route, according to an embodiment of this invention. The track 14 has locations 15-27 operative to fixture electronic devices 34, 36. FIG. 2 shows two adjacent locations 15,16 which are a distance "p"=pitch apart. Note that locations 15 and 17 are a distance 2 p apart, or twice the pitch. Bulk electronic devices 32 are loaded into a feeder 30 which loads parts 34, 36 into locations 18, 19 on the track 14. Note that the loader must load at least two parts since the track 14 will next index a distance of 2 p thereby bringing two new empty locations 16, 17 to the loader 30 and indexing electronic devices 34, 36 along the route to locations 20, 21. Two loaders could also be employed. With the next 2 p index of the track 14 the electronic devices are brought along the route to locations 22, 23 where they are tested by test stations 38, 40 in parallel. Following testing and storing of test results in the controller (not shown), the track 14 indexes the electronic devices in steps of size 2 p along the route to locations 26, 27 where the electronic devices 46, 48 are removed from the track 14 by sorting tubes 42, 44.

Since the track 14 is indexed by 2 p rather than p, it makes half as many stops and therefore dwells, accelerates and decelerates half as many times, thereby speeding up system throughput by nearly a factor of two. In addition, the concept can be extended to more than two sets of load, test and sort stations. For example, with three sets of load, test and sort stations, the stations would be arranged so that the system could index three times the pitch or 3 p with each index in order to test and sort all of the devices in a single pass. Embodiments of this invention use rotary tracks, where a disk-like assembly rotates with one or more tracks on or in its surface or linear tracks which may be flexible belts or other arrangements that permit the track to recirculate locations past stations.

Bulk devices can be singulated and loaded into the track using rotary feeders, vibratory bowl feeders, gravity, special mechanisms or a combination of these. The track may comprise a series of specially shaped recesses or holes arranged in a circular pattern on a rotary plate or more complex mechanisms including load fences and fluid ports, the common property being that they fixture devices so that the device can be indexed into position, probed, tested, and then ejected into one of a number of bins while the track indexes. The track is indexed from load position, where the devices are put in the track, through possible intermediate positions, then to test positions where the device is tested, through more possible intermediate positions and finally to sort position where the devices are removed from the track and sorted into bins. The track is then indexed back to load position in a series of steps. The instant invention is able to process devices in parallel on a single track by offsetting the positions of the test stations so that when the track is indexed by a predetermined amount greater than the offset, one portion of the devices will be presented to the first test station, while another portion of the devices will be presented to the second test station. Since the track is indexing twice as far per unit time, the system throughput will be nearly doubled. This arrangement of indexing at greater than the device pitch and placing two or more sets of loaders, test heads and sort bins at appropriate positions adjacent to the track permits the automated test system to process nearly twice as many parts per unit time with less hardware and less space than would be required if the track mechanisms were duplicated to provide the same throughput.

It will be apparent to those of ordinary skill in the art that many changes may be made to the details of the above-described embodiments of this invention without departing from the underlying principles thereof. The scope of the present invention should, therefore, be determined only by the following claims.

I claim:

1. A method of handling devices using a system, said system having a track for transporting said devices along a route, the method comprising:

providing said system with a first station adjacent to a first position along said route and a second station adjacent to a second position along said route; and indexing said track at least once to simultaneously transport a first portion of said devices and a second portion of said devices along said route to said first and second positions, respectively, from said first and second positions, respectively, or successively to and from said first and second positions, respectively, wherein each indexing is performed such that, for each index, said first and second portions of said devices are transported a pitch distance that is greater than a distance between the first position and the second position along the route.

2. The method of claim 1 wherein said device is an electronic device.

3. The method of claim 2 wherein said electronic device is a light emitting diode.

4. The method of claim 1 wherein said track is rotary.

5. The method of claim 1 wherein said track is linear.

6. The method of claim 1 wherein said system has more than one track.

7. The method of claim 2 wherein said electronic device is a passive electronic component.

8. The method of claim 1, wherein said pitch distance is an integer multiple of said distance between said first position and said second position along said route.

9. The method of claim 8, wherein said pitch distance is three times said distance between said first position and said second position along said route.

10. The method of claim 1, wherein said first station is a first test station and said second station is a second test station and wherein said method further comprises:

transporting, with said track, said first portion of said devices to said first position and said second portion of said devices to said second position;

testing said first portion of said devices with said first test station to obtain first test results;

testing said second portion of said devices with said second test station to obtain second test results; and after testing said first and second portions of said devices, transporting, with said track, said first portion of said devices from said first position and said second portion of said devices from said second position, wherein at least one selected from the group consisting of transporting said first and second portions of said devices to respective ones of said first and second positions and transporting said first and second portions of said devices from respective ones of said first and second positions comprises performing said indexing.

11. The method of claim 10, further comprising testing said first and second portions simultaneously.

12. The method of claim 1, wherein said first station is a first sorting station and said second station is a second sorting station and wherein said method further comprises:

transporting, with said track, said first portion of said devices to said first position and said second portion of said devices to said second position, wherein said transporting said first and second portions of said devices to respective ones of said first and second positions comprises performing said indexing;

sorting said first portion of said devices with said first sorting station based upon first test results previously obtained from a first test station; and sorting said second portion of said devices with said second sorting station based upon second test results previously obtained from a second test station.

13. The method of claim 12, further comprising sorting said first and second portions simultaneously.

14. A system for handling devices, comprising:

a track operative to transport said devices along a route by indexing;

a first station arranged adjacent to a first position along said route; and a second station arranged adjacent to a second position along said route;

wherein said track is operative to be indexed by a pitch distance at least once to simultaneously transport a first portion of said devices and a second portion of said devices along said route, to said first and second positions, respectively, from said first and second positions, respectively, or successively to and from said first and second positions, respectively, wherein said pitch distance is greater than a distance between the first position and the second position along the route.

15. The system of claim 14 wherein said track is rotary.

16. The system of claim 14 wherein said track is linear.

17. The system of claim 14 further comprising more than one track and at least one set of additional stations arranged adjacent to each track.

18. The system of claim 14, wherein said first station is a first test station and said second station is a second test station, wherein the first and second test stations are configured to test at least one selected from the group consisting of an electrical property and an optical property of the first and second portions of the devices, respectively.

19. The system of claim 14, wherein said first station is a first sort station and said second station is a second sort station, wherein the first and second sort stations are configured to sort the first and second portions of the devices, respectively, based upon test results previously obtained for the first and second portions of the devices, respectively.

20. The system of claim 14, wherein said pitch distance is an integer multiple of said distance between said first position and said second position along said route.

* * * * *